(12) United States Patent
King et al.

(10) Patent No.: US 7,208,934 B2
(45) Date of Patent: Apr. 24, 2007

(54) APPARATUS FOR IDENTIFICATION OF LOCATIONS OF A CIRCUIT WITHIN AN INTEGRATED CIRCUIT HAVING LOW SPEED PERFORMANCE

(75) Inventors: Ming-Chu King, Taichung (TW); Chia-Wen Shiue, Toucheng Township, Yilan County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 525 days.

(21) Appl. No.: 10/761,903

(22) Filed: Jan. 21, 2004

(65) Prior Publication Data
US 2005/0157593 A1    Jul. 21, 2005

(51) Int. Cl.
*G01R 23/02* (2006.01)

(52) U.S. Cl. .................................................. 324/76.39

(58) Field of Classification Search .............. 324/76.39
See application file for complete search history.

(56) References Cited

U.S. PATENT DOCUMENTS

| | | | |
|---|---|---|---|
| 5,790,479 A | 8/1998 | Conn | 368/118 |
| 6,071,003 A * | 6/2000 | Ashuri et al. | 716/6 |
| 6,134,191 A | 10/2000 | Alfke | 368/118 |
| 6,496,030 B1 * | 12/2002 | Kaneko | 326/16 |

* cited by examiner

*Primary Examiner*—Vincent Q. Nguyen
(74) *Attorney, Agent, or Firm*—Thomas, Kayden, Horstemeyer & Risley

(57) ABSTRACT

A test circuit for identification of locations with low speed performance. A grid of ring oscillator units and switches connect or disconnect the ring oscillator units to or from each other, such that the locations with low speed performance are identified according to frequencies of oscillation signals generated by rows and columns of ring oscillators respectively formed by operating the test circuit in two different modes.

9 Claims, 8 Drawing Sheets

APPARATUS FOR IDENTIFICATION OF LOCATIONS OF A CIRCUIT WITHIN AN INTEGRATED CIRCUIT HAVING LOW SPEED PERFORMANCE

BACKGROUND OF THE INVENTION

1. Field of the Invention

The present invention relates to a test circuit and particularly to a test circuit for identification of locations of a circuit within an integrated circuit having low speed performance.

2. Description of the Prior Art

Integrated circuits (ICs) are cornerstones of myriad computational systems, such as personal computers and communications networks. Users of such systems have come to enjoy substantial and continual improvements in speed performance over time. The demand for speed encourages system designers to select ICs with superior speed performance. This leads IC manufacturers to carefully test the speed performance of their designs.

Integrated circuit devices typically include numerous electrical and/or electronic elements that are fabricated on, for example, silicon wafers to perform a particular function. The sequence of steps that occur in the course of manufacturing an IC device can be grouped broadly into design and fabrication phases.

The design phase begins by determining the desired functions and necessary operating specifications of the IC device. The IC device is then designed from the "top down"; that is, large functional blocks are first identified, then sub-blocks are selected, and the logic gates needed to implement the sub-blocks are chosen. Each logic gate is designed through the appropriate connection of, for example, transistors and resistors. The logic gates and other circuit components are then combined to form schematic diagrams.

After the various levels of design are completed, each level is checked to ensure correct functionality, and then test vectors are generated from the schematic diagrams. Next, the circuit is laid out. A layout consists of sets of patterns that will be transferred to the silicon wafer. These patterns correspond to, for example, the formation of transistors and interconnect structures. The layout is designed from the "bottom up"; for example, basic components (e.g., transistors) are first laid out, then logic gates are created by interconnecting appropriate basic components, forming the logic gates into sub-blocks, and finally connecting appropriate sub-blocks to form functional blocks. Power buses, clock-lines, and input-output pads required by the circuit design are also incorporated during the layout process. The completed layout is then subjected to a set of design rule checks and propagation delay simulations to verify that a correct implementation of the circuit design has been achieved. After this checking procedure, the layout is used to generate a set of masks to be used during the fabrication phase to specify the circuit patterns on the silicon wafer.

The fabrication phase that follows the design phase includes a sequence of process steps during which the set of masks transfer the layout patterns onto a silicon wafer using photolithographic and film formation processes. The process parameters (e.g., temperature, pressure, deposition rates and times, etch rates and times) associated with the process steps are typically developed and refined during an initial development stage. These refined process parameters are then used to produce a final fabrication process used during IC production.

Test structures formed on the wafer during the development stage of the fabrication phase are utilized to identify the precise structural nature of defects caused by non-optimal process parameters, thereby facilitating the refinement of the final fabrication process. These test structures are deemed necessary, as the physical nature of these defects cannot be discerned from output data of the ICs. Specifically, IC defects produce functional errors in the output data. These functional errors provide little or no information to identify the physical structure causing the defect. Even with test structures, information about the exact location and nature of the defect is still not readily obtainable. Thus, failure analysis remains difficult and time consuming.

Certain test structures are known in the prior art. For example, U.S. Pat. No. 5,790,479 discloses a test circuit for characterizing interconnect timing characteristics is disclosed in. Referring to FIG. 1, and as described in U.S. Pat. No. 5,790,479, a first inverter 110 has an output terminal 111 coupled to a first reference programmable intersection point (PIP) 114 by a first reference interconnect 112. The first reference PIP 114 is coupled to an input terminal 119 of a second inverter 120 by a second reference interconnect 116. A first test PIP 117 has a pass transistor which couples the second reference interconnect 116 to a first test interconnect 118 when the pass transistor of test PIP 117 is turned on. An output terminal 121 of the second inverter 120 is coupled to a second reference PIP 124 by a reference interconnect 122. The second reference PIP 124 is also coupled to an input terminal 129 of a third inverter 130 by a reference interconnect 126. A second test PIP 127 has a pass transistor which couples the reference interconnect 122 to a second test interconnect 128 when the pass transistor of the second test PIP 127 is turned on. An output terminal 131 of the third inverter 130 is coupled to a third reference PIP 134 by a reference interconnect 132. The third reference PIP 134 is also coupled to the input terminal of a buffer 140 by a reference interconnect 136. An output terminal 141 of the buffer 140 is coupled to a fourth reference PIP 144 by a reference interconnect 142. The fourth reference PIP 144 is also coupled to an input terminal 149 of a fourth inverter 150 by a reference interconnect 146.

An output terminal 151 of the fourth inverter 150 is coupled to a fifth reference PIP 154 by a reference interconnect 152. The fifth reference PIP 154 is coupled to the input terminal of a fifth inverter 160 by a reference interconnect 156. An output terminal 161 of the fifth inverter 160 is coupled to a sixth reference PIP 164 by a reference interconnect 162. The sixth reference PIP 164 is coupled to an input terminal 109 of the first inverter 110 by a reference interconnect 166. Each of the reference PIPs 114, 124, 134, 144, 154 and 164 has a pass transistor which is turned ON to allow current to flow through each of the six configuration logic blocks (CLBs) 110, 120, 130, 140, 150, and 160 forming the exemplary reference ring oscillator circuit (RROC) 100. In this state, if test PIPs 117, 127 are both turned OFF, the RROC 100 oscillates in an unloaded state. When at least one test PIP 117, 127 is turned ON, the RROC 100 is loaded by at least one test interconnect structure 118, 128 and the RROC 100 is said to be in a loaded state. Any one of the twelve reference interconnects 112, 116, 122, 126, 132, 136, 142, 146, 152, 156, 162, 166 may be coupled to a test interconnect structure by a test PIP. The test interconnect structures 118 and 128 can include an interconnect wire (e.g., single length line, longline, etc.) or any active device on the substrate of an integrated circuit.

Six segments of the RROC 100 are defined, each comprising a signal path which begins at a CLB output terminal 111, 121, 131, 141, 151, 161 of one stage and extends to a CLB input terminal 119, 129, 139, 149, 159 and 109, respectively, of the next stage in the ring. For example, a first segment of the RROC 100 begins at the CLB output terminal 111 of CLB 110 and ends at the CLB input terminal 119 of the next CLB 120. Test points, accessible to test probes (not shown), are provided at the input terminals 109, 119, 129, 139, 149 and 159, and at the output terminals 111, 121, 131, 141, 151 and 161 of each stage of the RROC 100. Segments of the RROC 100 having a test PIP are referred to as test segments of the RROC 100. Although there are only two test interconnect structures 118 and 128 shown in the RROC 100, every segment of the RROC 100 can be a test segment having a test PIP which couples a test interconnect structure to the segment.

FIG. 2 is a schematic diagram of an oscillator 200 including a pair of similar test circuits 210A and 210B, as disclosed in U.S. Pat. No. 6,134,191. Test circuits 210A and 210B may be any signal paths for which the associated signal propagation delays are applicable. For example, test circuits 210A and 210B are signal paths on a field-programmable gate array (FPGA).

Oscillator 200 provides a test-clock signal TCLK on a like-named output terminal. The period $T_{TCLK}$ of test-clock signal TCLK is a function of the propagation delay for rising-edge signals traversing test circuits 210A and 210B. The period $T_{TCLK}$ can therefore be used to determine the rising-edge delays $D_{RA}$ and $D_{RB}$ for respective test circuits 210A and 210B.

Test circuits 210A and 210B are included within a pair of respective signal paths 215A and 215B. Signal path 215A includes an output terminal 220 connected to the "0" input of a multiplexer 225; signal path 215B includes an output terminal 230 connected to the "1" input of multiplexer 225. Output terminal TCLK connects to respective input terminals of signal paths 215A and 215B and to the select input S of multiplexer 225. Also included in signal paths 215A and 215B are a respective pair of inverters 235A and 235B. Inverter 235A is connected between output terminal TCLK and an input terminal 240 of test circuit 210A. Inverter 220B is connected between an output terminal 245 of test circuit 210B and the "1" input of multiplexer 225.

However, the test circuits described in the patents identified above still suffer various shortcomings, such as each requires the test segments be tested one by one, which is time consuming.

SUMMARY OF THE INVENTION

One object of the present invention is to provide a test circuit for effective identification of defect locations with low speed performance. In this regard, one embodiment of the present invention is directed to a test circuit for effective identification of defect locations with low speed performance. In this embodiment, a grid ring oscillator detects the propagation delay through vertical and horizontal branch circuits. The critical locations with low speed performance are identified by combining the test results of the vertical and horizontal branch circuits.

In one embodiment, a test circuit is provided for identification of locations in an integrated circuit with low speed performance comprising a plurality of ring oscillator units arranged in a grid composed of columns and rows, each comprising a first and second inverter string, each first and second inverter string having an input and output terminal, wherein the output and input terminals of the first and second inverter string of each ring oscillator unit in the last column of the grid are respectively coupled to each other. A plurality of first switches, each of which is coupled to the output terminal of the first inverter string and the input terminal of the second inverter string of one of the ring oscillator units. A plurality of second switches are coupled to the output and input terminal respectively of the second and first inverter string of two adjacent ring oscillator units in one of the columns, a plurality of third switches, each of which is coupled to the output and input terminal respectively of the two first inverter strings of two adjacent ring oscillator units in one of the rows, and between the output and input terminal respectively of the two second inverter strings of two adjacent ring oscillator units in one of the rows. Pairs of a fourth switch and third inverter, coupled to the input and output terminal respectively of the first and second inverter string of one of the ring oscillator units in the first column of the grid. The fourth switch is serially coupled to the third inverter in each pair, and pairs of a fifth switch and fourth inverter, each of the pairs coupled to the output and input terminal respectively of the second and first inverter string of the last and the first ring oscillator units in one of the columns. The fifth switch is serially coupled to the fourth inverter in each pair. IN this configuration, the locations with low speed performance are identified according to frequencies of oscillation signals generated by rows of ring oscillators formed by opening the first, second and fifth switches, and closing the third and fourth switches, and columns of ring oscillators formed by closing the first, second and fifth switches, and opening the third and fourth switches.

The another embodiment, a test circuit for identification of locations with low speed performance comprising a plurality of ring oscillator units arranged in a grid composed of columns and rows. Each of the ring oscillator units comprises a first and second inverter, and each first and second inverter has an input and output terminal, wherein the output and input terminal respectively of the first and second inverter of each ring oscillator units in the last column of the grid are coupled to each other. A plurality of first switches are coupled to the output terminal of the first inverter and the input terminal of the second inverter of one of the ring oscillator units. A plurality of second switches are coupled to the output and input terminal, respectively, of the second and first inverter of two adjacent ring oscillator units in one of the columns, a plurality of third switches, each of which is coupled to the output and input terminal respectively of the two first inverters of two adjacent ring oscillator units in one of the rows and between the output and input terminal respectively of the two second inverters of two adjacent ring oscillator units in one of the rows. Pairs of a fourth switch and third inverter are coupled to the input and output terminal, respectively, of the first and second inverter of one of the ring oscillator units in the first column of the grid. The fourth switch is serially coupled to the third inverter in each pair. Pairs of a fifth switch and fourth inverter are coupled to the output and input terminal respectively of the second and first inverter of the last and the first ring oscillator units in one of the columns. The fifth switch is serially coupled to the fourth inverter in each pair. In this configuration, the locations with low speed performance are identified according to frequencies of oscillation signals generated by rows of ring oscillators formed by opening the first, second, and fifth switches, and closing the third and fourth switches, and columns of ring oscillators formed by closing the first, second and fifth switches, and opening the third and fourth switches.

BRIEF DESCRIPTION OF THE DRAWINGS

The present invention will become more fully understood from the detailed description given hereinbelow and the accompanying drawings, given by way of illustration only and thus not intended to be limiting on the present invention.

DETAILED DESCRIPTION OF THE INVENTION

First Embodiment

Figure 1:
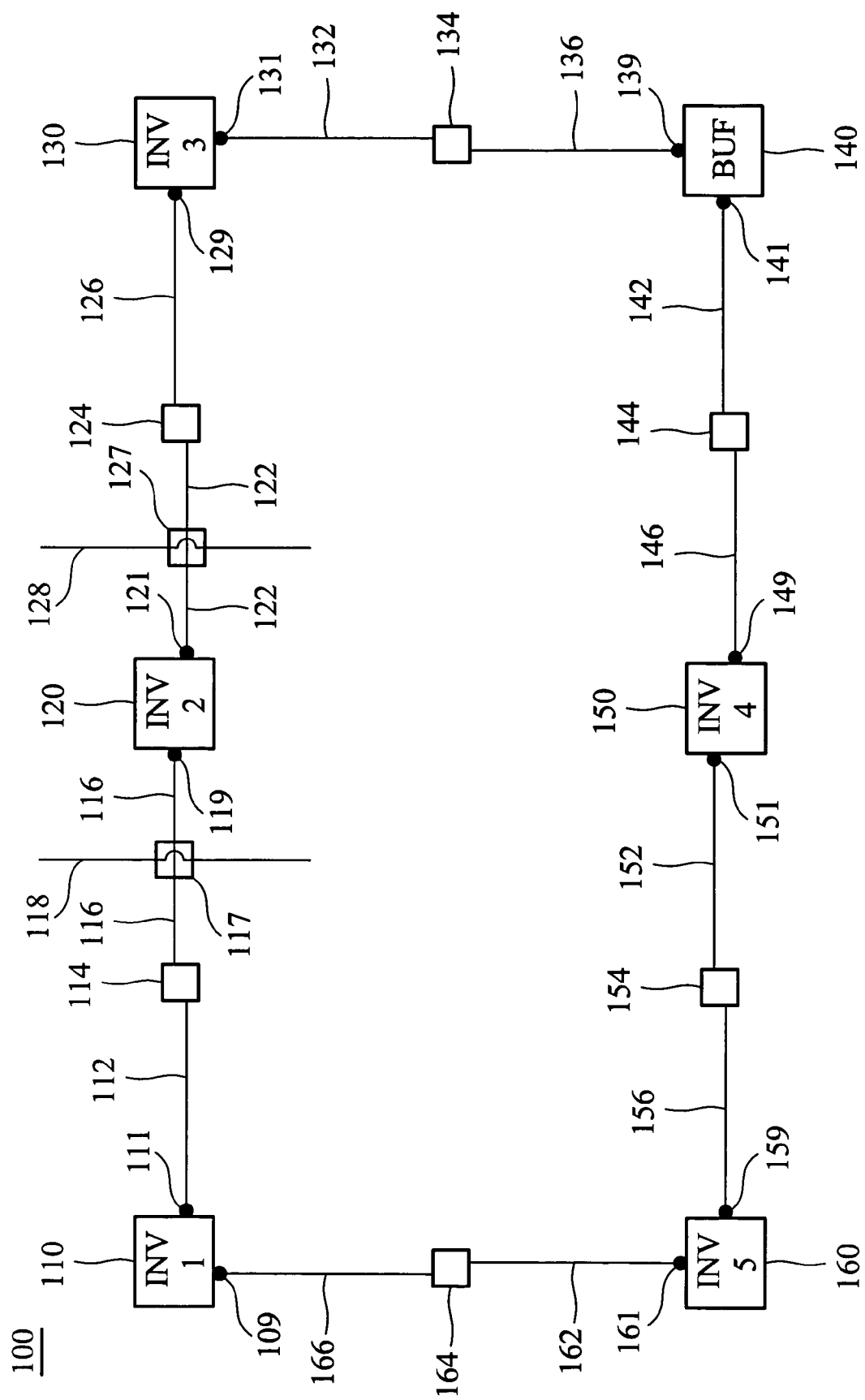
FIG. 1 is a diagram showing a test circuit for characterizing interconnect timing characteristics, as disclosed in U.S. Pat. No. 5,790,479.
Figure 2:
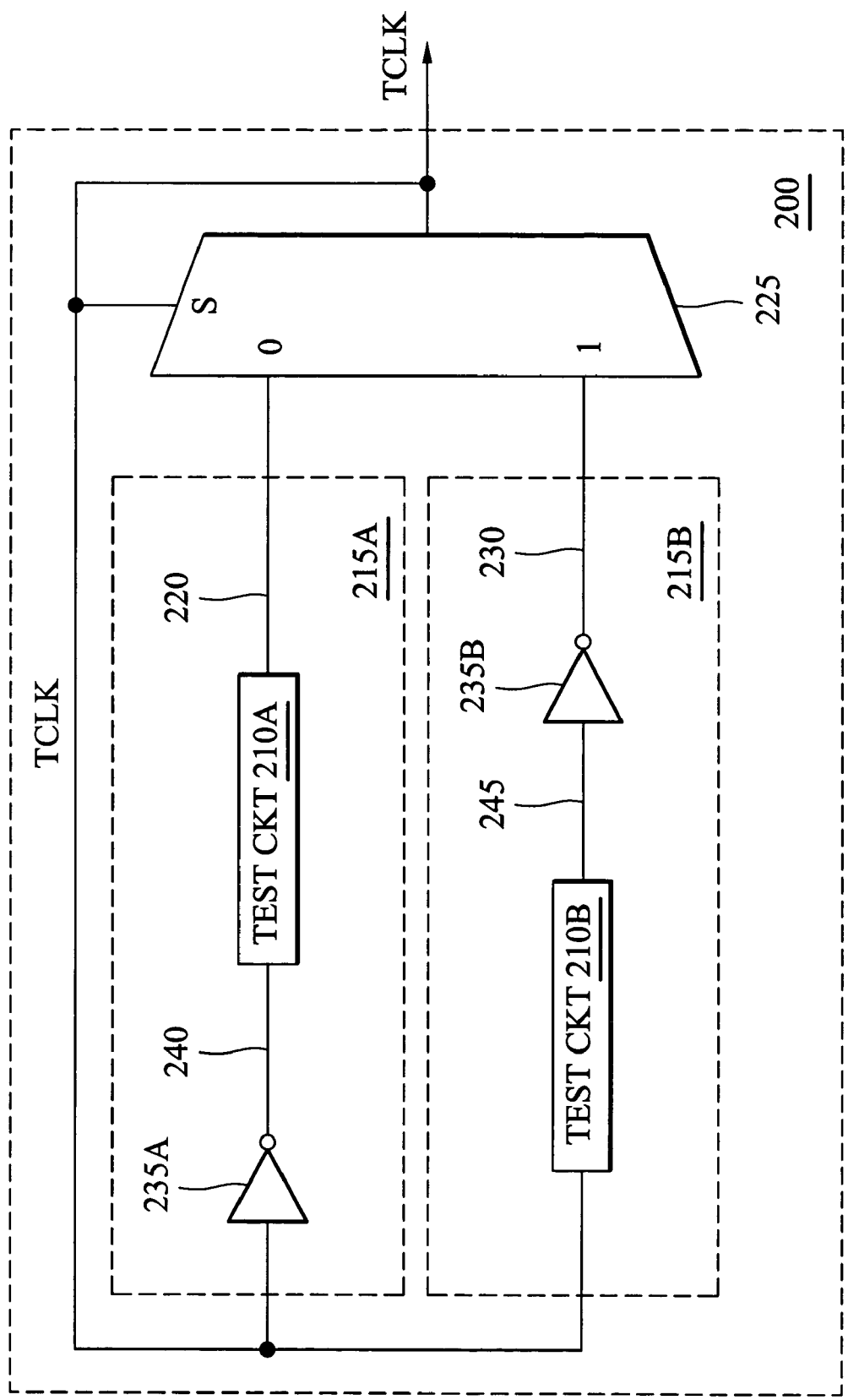
FIG. 2 is a diagram showing an oscillator including a pair of similar test circuits, as disclosed in U.S. Pat. No. 6,134,191.
Figure 3A:
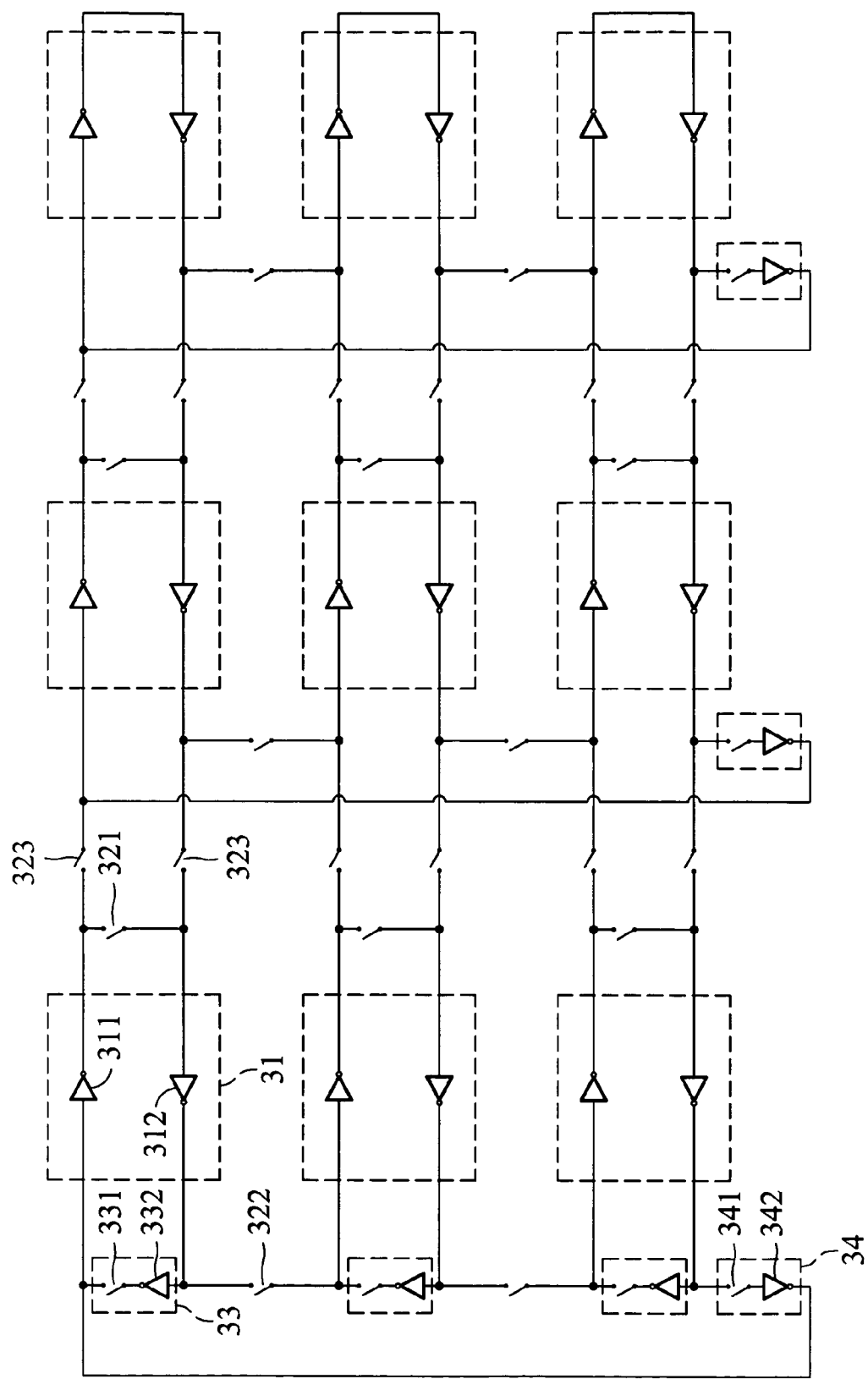
FIG. 3A is a diagram showing a test circuit for identification of locations with low speed performance according to a first embodiment of the invention.

FIG. 3A is a diagram showing a test circuit for identification of locations with low speed performance according to a first embodiment of the invention. The test circuit for identification of locations with low speed performance includes ring oscillator units 31, switches 321, 322 and 323, and element pairs 33 and 34.

The ring oscillator units 31 are arranged in a grid composed of columns and rows. A grid composed of three columns and three rows is illustrated for example in FIG. 3A. Each of the ring oscillator units 31 includes two inverters 311 and 312. Each of the inverters 311 and 312 has an input and output terminal. The output and input terminal respectively of the inverters 311 and 312 of each ring oscillator units 31 in the last column of the grid are coupled to each other.

Each of the switches 321 is coupled to the output terminal of the inverter 311 and the input terminal of the inverter 312 of one of the ring oscillator units 31. Each of the switches 322 is coupled to the output and input terminal respectively of the inverter 312 and 311 of two adjacent ring oscillator units 31 in one of the columns. Each of the switches 323 is coupled to the output and input terminal respectively of the two inverters 311 of two adjacent ring oscillator units 31 in one of the rows, and between the output and input terminal respectively of the two inverters 312 of two adjacent ring oscillator units 31 in one of the rows.

Each of the element pairs 33 includes a switch 331 and inverter 332, and is coupled to the input and output terminal respectively of the inverters 311 and 312 of one of the ring oscillator units 31 in the first column of the grid. In each element pair 33, the switch 331 is serially coupled to the inverter 332.

Each of the element pairs 34 includes a switch 341 and inverter 342, and is coupled to the output and input terminal respectively of the inverters 312 and 311 of the last and the first ring oscillator units 31 in one of the columns. In each element pair 34, the switch 341 is serially coupled to the inverter 342.

Figure 3B:
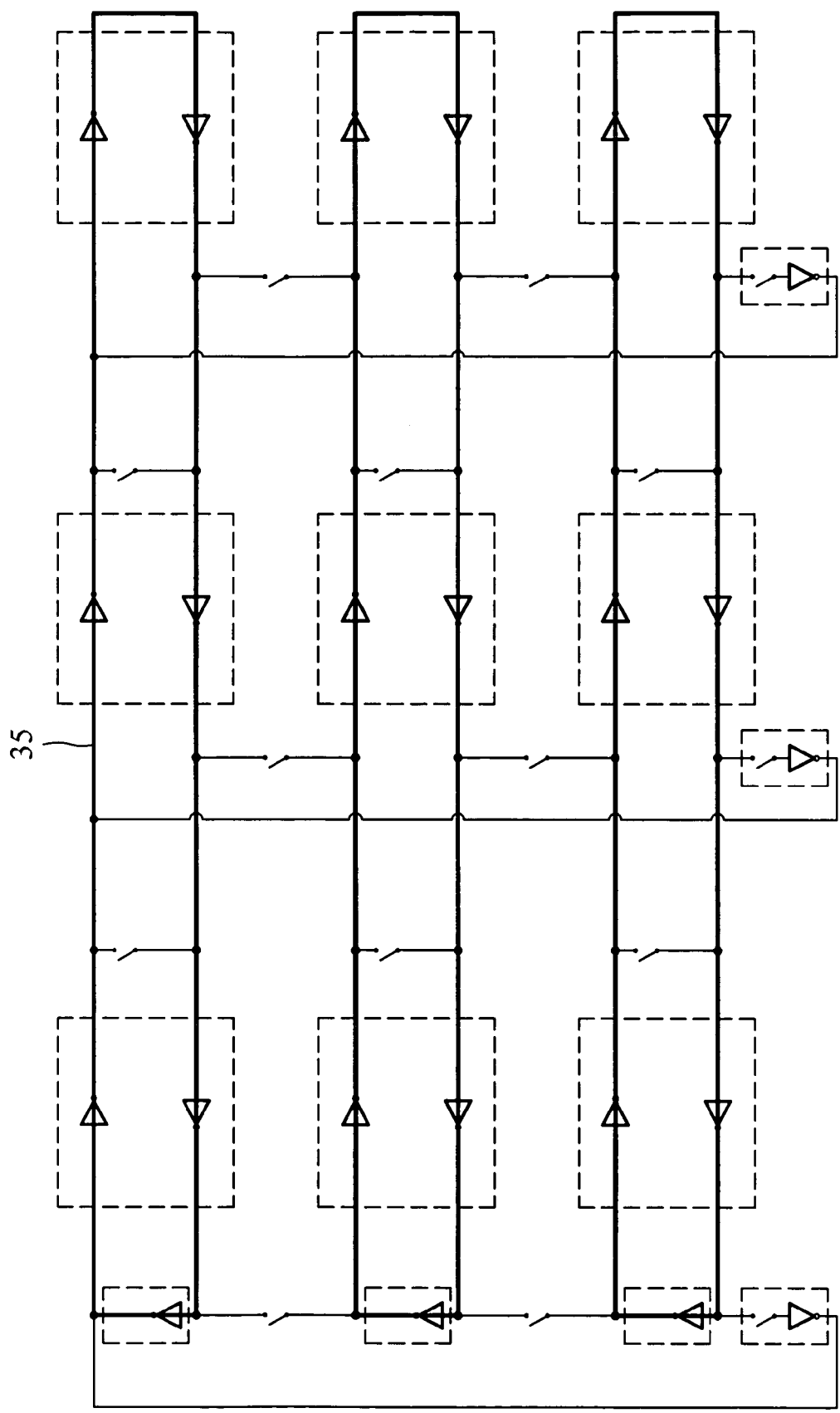
FIG. 3B and 3C are diagrams showing the test circuit operating in Mode-1 and Mode-2 according to the first embodiment of the invention.
Figure 3C:
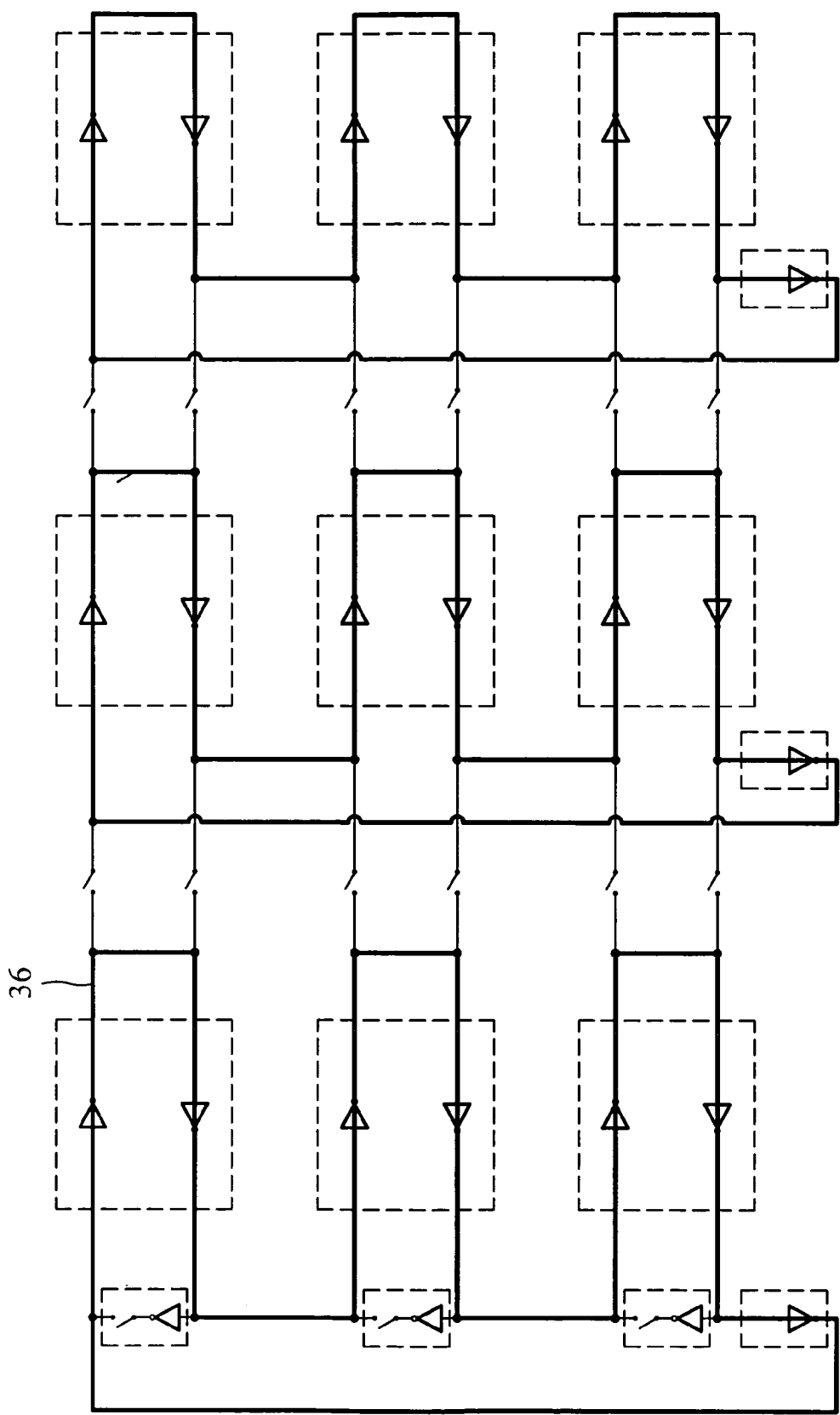

FIG. 3B and 3C are diagrams showing the test circuit operating in Mode-1 and Mode-2 according to the first embodiment of the invention.

In Mode-1, the switches 321, 322 and 341 are opened while the switches 323 and 331 are closed. Thus, in each row of the grid, the ring oscillator units 31 form a complete ring oscillator, as shown by the close loops 35 in FIG. 3B. Since an odd number of inverters are included in each loops 35, an oscillation signal can be detected at any node between two adjacent inverters.

In Mode-2, the switches 321, 322 and 341 are closed while the switches 323 and 331 are opened. Thus, in each column of the grid, the ring oscillator units 31 form a complete ring oscillator, as shown by the close loops 36 in FIG. 3C. Since an odd number of inverters are included in each loops 36, an oscillation signal can be detected at any node between two adjacent inverters.

By operating the test circuit in Mode-1, the frequencies of the oscillation signal can be derived by measuring the propagation delay of each row of ring oscillator using a spectrum analyzer. Similarly, by operating the test circuit in Mode-2, the frequencies of the oscillation signal can be derived by measuring the propagation delay of each column of ring oscillator. Accordingly, the locations with low speed performance are addressed by specific columns and rows.

Second Embodiment

Figure 4:
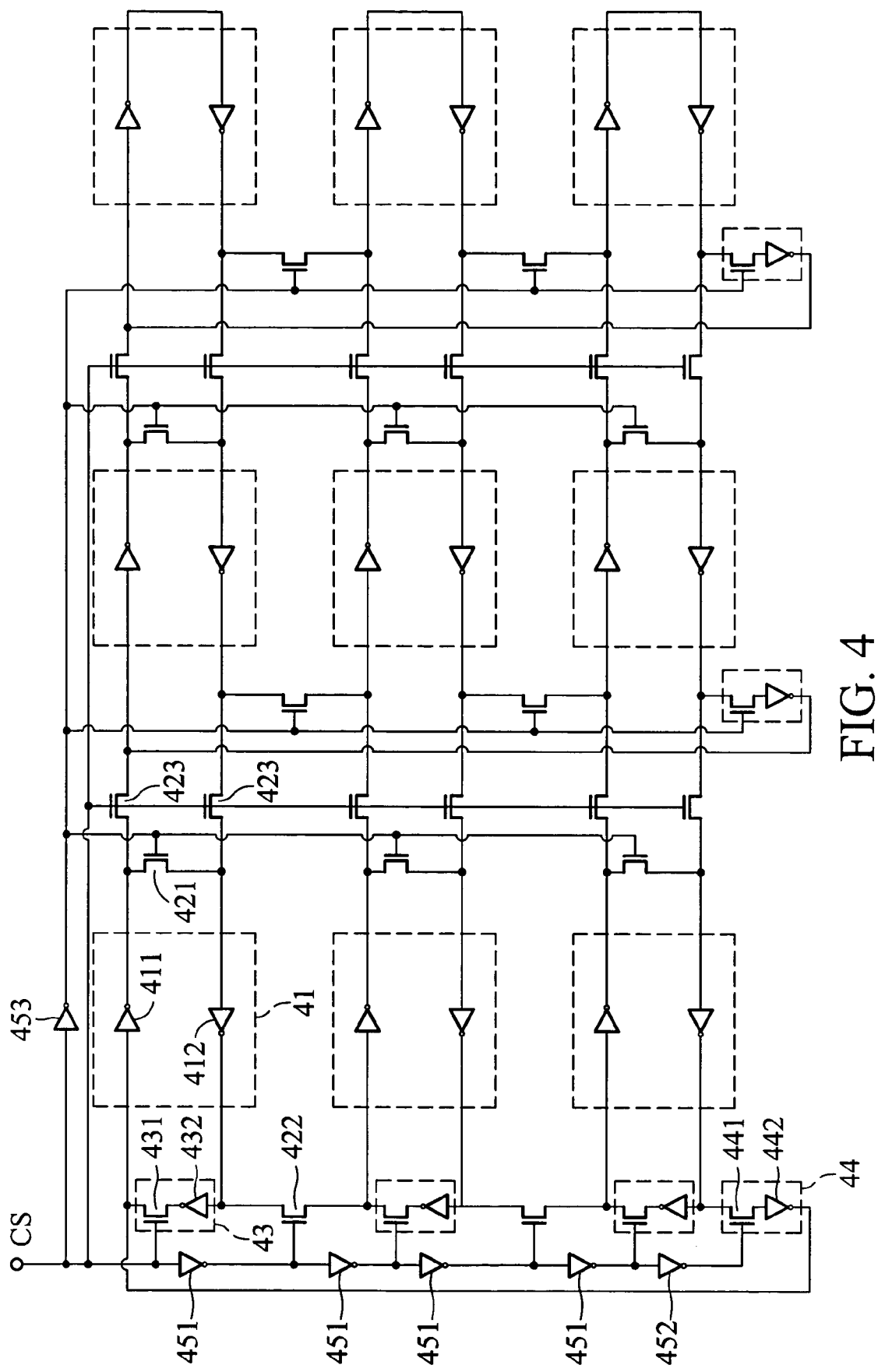
FIG. 4 is a diagram showing a test circuit for identification of locations with low speed performance according to a second embodiment of the invention.

FIG. 4 is a diagram showing a test circuit for identification of locations with low speed performance according to a second embodiment of the invention. The test circuit for identification of locations with low speed performance includes ring oscillator units 41, nMOS transistors 421, 422 and 423, element pairs 43 and 44, and a switch control circuit composed of inverters 451, 452 and 453.

The ring oscillator units 41 are arranged in a grid composed of columns and rows. A grid composed of 3 columns and 3 rows is illustrated for example in FIG. 4. Each of the ring oscillator units 41 includes two inverters 411 and 412. Each of the inverters 411 and 412 has an input and output terminal. The output and input terminal respectively of the inverters 411 and 412 of each ring oscillator units 31 in the last column of the grid are coupled to each other.

Each of the nMOS transistors 421 has a drain and source coupled to the output terminal of the inverter 411 and the input terminal of the inverter 412 of one of the ring oscillator units 41. Each of the nMOS transistors 422 has a drain and source coupled to the output and input terminal respectively of the inverter 412 and 411 of two adjacent ring oscillator units 41 in one of the columns. Each of the nMOS transistors 423 has a drain and source coupled to the output and input terminal respectively of the two inverters 411 of two adjacent ring oscillator units 41 in one of the rows, and between the output and input terminal respectively of the two inverters 412 of two adjacent ring oscillator units 41 in one of the rows.

Each of the element pairs 43 includes a nMOS transistor 431 and inverter 432, and is coupled to the input and output terminal respectively of the inverters 411 and 412 of one of the ring oscillator units 41 in the first column of the grid. In each element pair 43, the transistor 431 has a drain or source coupled to the inverter 432.

Each of the element pairs 44 includes a nMOS transistor 441 and inverter 442, and is coupled to the output and input terminal respectively of the inverters 412 and 411 of the last and the first ring oscillator units 41 in one of the columns.

In each element pair 44, the transistor 441 has a drain or source coupled to the inverter 442.

The switch control circuit generates gate signals to gates of the nMOS transistors 421, 422, 423, 431 and 441, and includes inverters 451, 452 and 453. The gates of the transistors 423 are coupled to receive a control signal CS. The string of inverters 451 receives the control signal CS, each of which has an input and output terminal respectively coupled to the gates of two adjacent transistors 422 and 431. The inverter 452 has an input and output terminal respectively coupled to the gates of two adjacent transistors 431 and 441. The inverter 453 has an output terminal coupled to all the gates of the transistors 421 and 422, and an input terminal coupled to receive the control signal CS.

In Mode-1, the control signal CS is pulled up so that the nMOS transistors 421, 422 and 441 are turned off while the nMOS transistors 423 and 431 are turned on. Thus, in each row of the grid, the ring oscillator units 41 form a complete ring oscillator. Since an odd number of inverters are included in this ring oscillator, an oscillation signal can be detected at any node between two adjacent inverters.

In Mode-2, the control signal CS is pulled down so that the nMOS transistors 421, 422 and 441 are turned on while the nMOS transistors 423 and 431 are turned off. Thus, in each column of the grid, the ring oscillator units 41 form a complete ring oscillator. Since an odd number of inverters are included in this ring oscillator, an oscillation signal can be detected at any node between two adjacent inverters.

By operating the test circuit in Mode-1, the frequencies of the oscillation signal can be derived by measuring the propagation delay of each row of ring oscillator using a spectrum analyzer. Similarly, by operating the test circuit in Mode-2, the frequencies of the oscillation signal can be derived by measuring the propagation delay of each column of ring oscillator. Accordingly, the locations with low speed performance are addressed by specific columns and rows.

Third Embodiment

Figure 5:
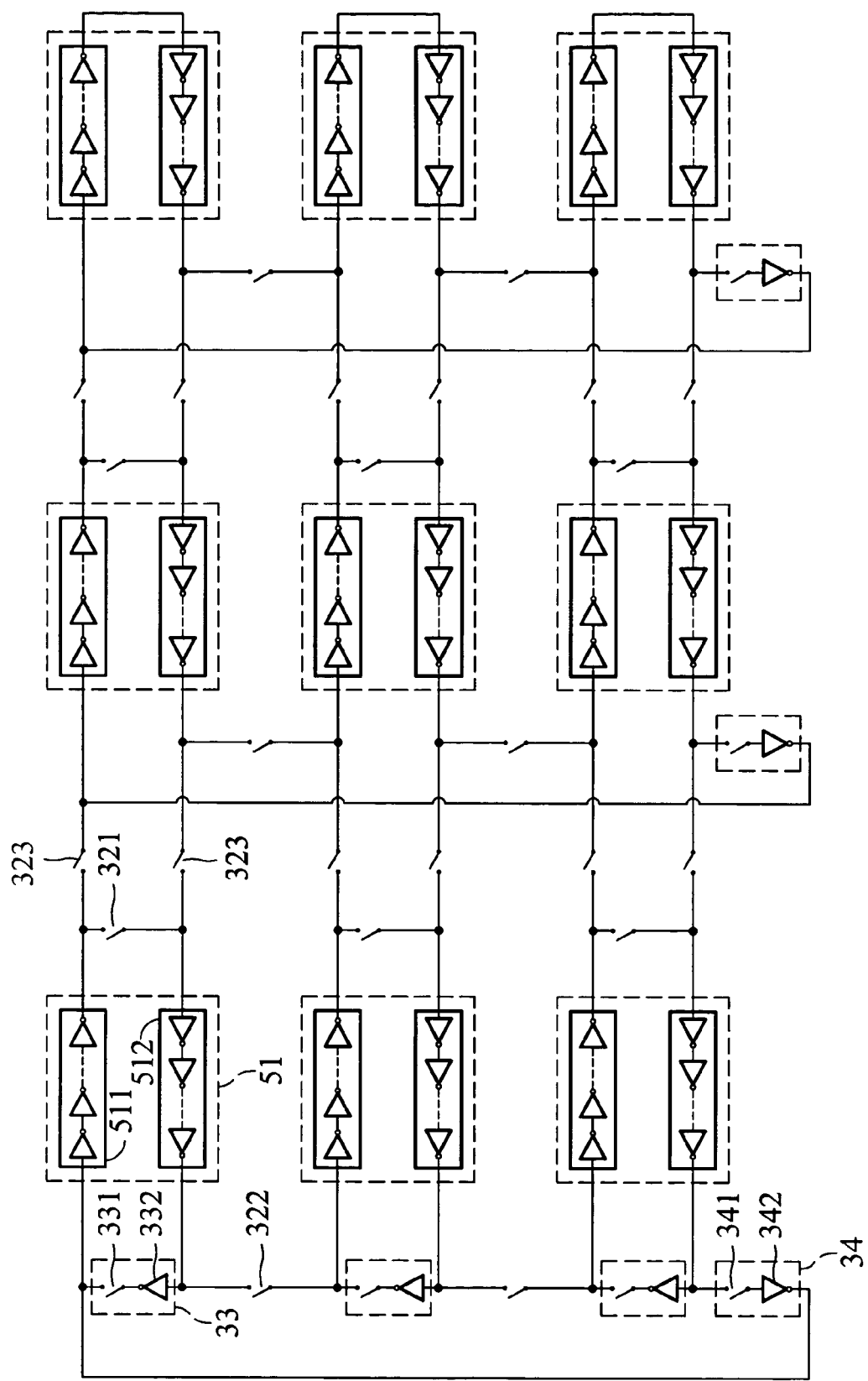
FIG. 5 is a diagram showing a test circuit for identification of locations with low speed performance according to a third embodiment of the invention.

FIG. 5 is a diagram showing a test circuit for identification of locations with low speed performance according to a third embodiment of the invention. It is noted that the test circuit in FIG. 5 is similar to that in FIG. 3A except that the ring oscillator unit 51 has two inverter strings 511 and 512 rather than two inverters. Since a ring oscillator must have an odd number of inverters, the numbers of inverters included in the inverter strings 511 and 512 should be the same, or the number of inverters included in one ring oscillator unit 51 should be even.

Fourth Embodiment

Figure 6:
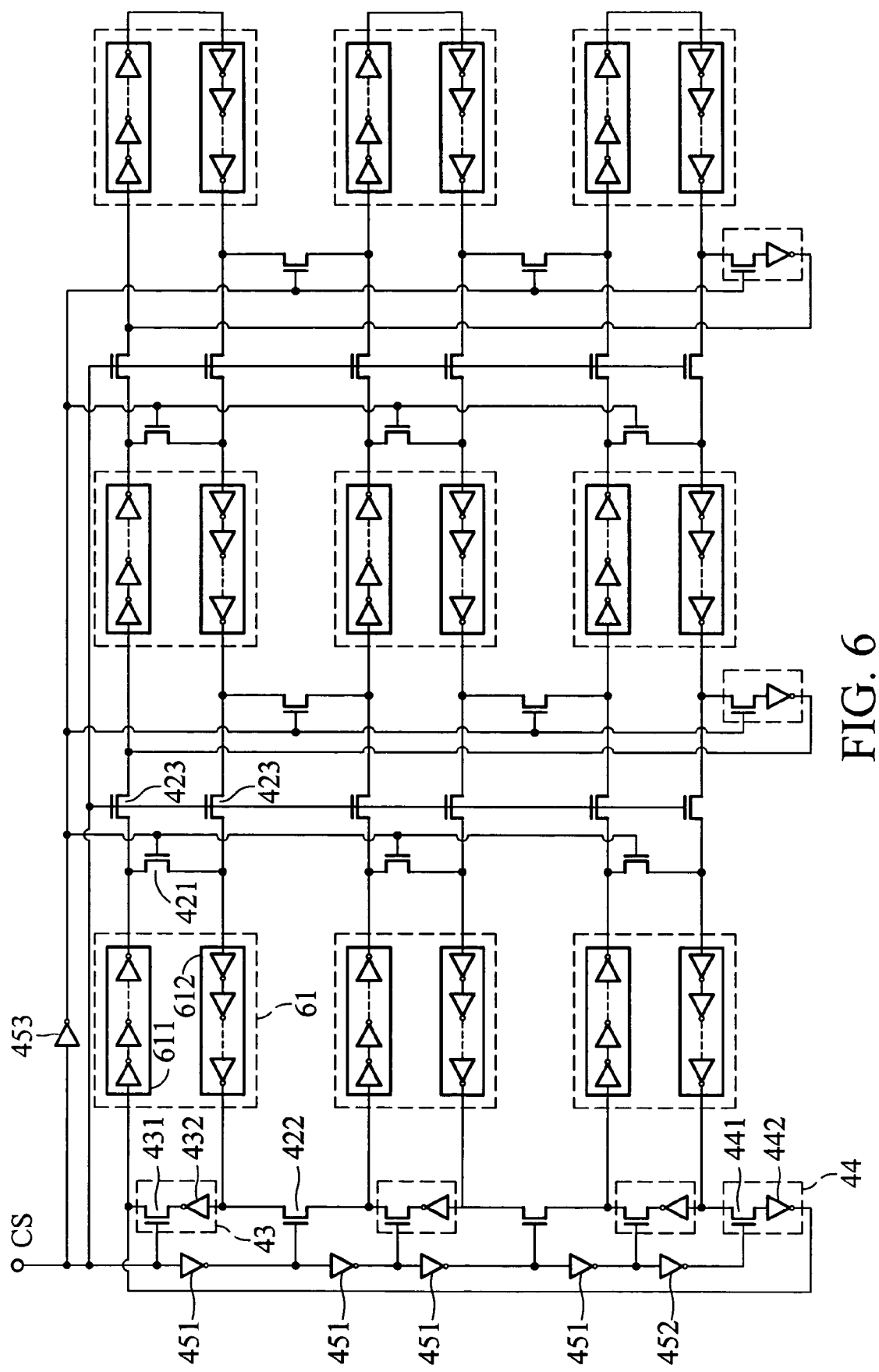
FIG. 6 is a diagram showing a test circuit for identification of locations with low speed performance according to a fourth embodiment of the invention.

FIG. 6 is a diagram showing a test circuit for identification of locations with low speed performance according to a third embodiment of the invention. It is noted that the test circuit in FIG. 6 is similar to that in FIG. 4 except that the ring oscillator unit 61 has two inverter strings 611 and 612 rather than two inverters. Similarly, since a ring oscillator must have an odd number of inverters, the numbers of inverters included in the inverter strings 611 and 612 should be the same, or the number of inverters included in one ring oscillator unit 61 should be even.

In conclusion, the present invention is directed to a test circuit for effective identification of defect locations with low speed performance. A grid ring oscillator detects the propagation delay through vertical and horizontal branch circuits. The critical locations with low speed performance are identified by combining the test results of the vertical and horizontal branch circuits.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A test circuit for identification of locations with low speed performance comprising:
   a grid of units, each unit having a first and second inverter, and the first and second inverter of each unit in a last column being coupled to each other;
   first switches, each coupled between the first and second inverter of one of the units;
   second switches, each coupled between the second and first inverter respectively of two adjacent units in a same column;
   third switches, each coupled between the two first or second inverters of adjacent units in a same row;
   pairs of serially connected fourth switch and third inverter, each coupled between the first and second inverter of one of the units in a first column; and
   pairs of serially connected fifth switch and fourth inverter, each coupled between the second and first inverter respectively of a last and first unit in a same column.

2. The test circuit as claimed in claim 1, wherein the locations with low speed performance are identified according to frequencies of oscillation signals generated by rows of ring oscillators formed by opening the first, second and fifth switches, and closing the third and fourth switches, and columns of ring oscillators formed by closing the first, second and fifth switches, and opening the third and fourth switches.

3. The test circuit as claimed in claim 1, wherein the first and second inverters are inverter strings having the same number of inverters.

4. The test circuit as claimed in claim 1, wherein the first and second inverter of one of the units are inverter strings comprising an even number of inverters.

5. A test circuit for identification of locations with low speed performance comprising:
   a grid of units, each unit having a first and second inverter, and the first and second inverter of each unit in a last column being coupled to each other;
   first transistors, each having a drain and source respectively coupled to the first inverter and the second inverter of one of the units;
   second transistors, each having a drain and source respectively coupled to the second and first inverter of two adjacent units in a same column;
   third transistors, each having a drain and source respectively coupled to the two first or second inverters of adjacent units in a same row;
   pairs of serially connected fourth transistor and third inverter, each coupled between the first and second inverter of one of the units in a first column; and
   pairs of serially connected fifth transistor and fourth inverter, each coupled between the second and first inverter of a last and first unit in a same column; and
   a switch control circuit generating gate signals to gates of all the transistors.

6. The test circuit as claimed in claim 5, wherein the locations with low speed performance are identified according to frequencies of oscillation signals generated by rows of ring oscillators formed by the switch control circuit turning off the first, second and fifth transistors, and turning on the third and fourth transistors, and columns of ring oscillators formed by the switch control circuit turning on the first, second and fifth transistors, and turning off the third and fourth transistors.

7. The test circuit as claimed in claim 5, wherein the first and second inverters are inverter strings having the same number of inverters.

8. The test circuit as claimed in claim 5, wherein the first and second inverters of one of the units are inverter strings having an even number of inverters.

9. The test circuit as claimed in claim 5, wherein the gates of the third transistors are coupled to receive a control signal and the switch control circuit comprises:
- a string of fifth inverters receiving the control signal, each of which has an input and output terminal respectively coupled to the gates of the adjacent fourth and second transistors;
- a sixth inverter has an input and output terminal respectively coupled to the gates of the adjacent fourth and fifth transistors; and
- a seventh inverter has an output terminal coupled to all the gates of the first and second transistors, and an input terminal coupled to receive the control signal.

* * * * *